United States Patent [19]

Ozaki et al.

[11] Patent Number: 4,532,549
[45] Date of Patent: Jul. 30, 1985

[54] SOLID-STATE IMAGING DEVICE WITH HIGH QUASI-SIGNAL SWEEP-OUT EFFICIENCY AND HIGH SIGNAL CHARGE TRANSFER EFFICIENCY

[75] Inventors: Toshifumi Ozaki, Tokyo; Shinya Ohba, Kanagawa; Iwao Takemoto, Tokyo; Masaaki Nakai, Tokorozawa; Haruhisa Ando; Shusaku Nagahara, both of Hachioji; Takuya Imaide, Yokohama; Kenji Takahashi; Toshiyuki Akiyama, both of Kodaira, all of Japan

[73] Assignee: Hitachi, Ltd., Tokyo, Japan

[21] Appl. No.: 473,865

[22] Filed: Mar. 10, 1983

[30] Foreign Application Priority Data

Mar. 15, 1982 [JP] Japan ................................. 57-39368

[51] Int. Cl.³ .............................................. H01N 3/14
[52] U.S. Cl. ................................... 358/213; 358/212; 358/209
[58] Field of Search .................. 358/213, 212, 209, 41

[56] References Cited

U.S. PATENT DOCUMENTS 4,366,503 12/1982 Terakawa et al. .................. 358/213
4,430,672 2/1984 Berger ................................. 358/213
4,450,484 5/1984 Terakawa et al. .................. 358/213

Primary Examiner—Gene Z. Rubinson
Assistant Examiner—Robert Lev

Attorney, Agent, or Firm—Antonelli, Terry & Wands

[57] ABSTRACT

Disclosed is a solid-state imaging device wherein optical information of a number of photo-electric conversion elements arranged in a matrix is read into vertical signal lines by a vertical shift register and then the optical information on the vertical signal lines is horizontally scanned by a horizontal register of a charge transfer device. Bias charge storage means and quasi-signal sweep-out drains are disposed between the horizontal register and the vertical signal lines, and a bias charge input means is arranged in the horizontal register. In order to ensure high efficiency in transferring signals between the vertical lines to the storage means, the sweep-out drains and the charge transfer device, it is arranged for bias charges to be provided at each stage of transfer. Thus, bias charges supplied from the storage means are used to transfer charges from the vertical lines to the storage means. Similarly bias charges directly injected from the quasi-signal sweep-out drains are used to sweep out quasi-signals from the storage means to the quasi-signal sweep-out drains. Finally bias charges supplied from the bias charge input means of the charge transfer device are used to read signals from the storage means into the charge transfer device. By virtue of this, the sweep-out efficiency of the quasi-signals from the capacitances which supply the bias charges and a read-out efficiency of the signal charges are enhanced and a high quality of video signal is produced.

4 Claims, 15 Drawing Figures

FIG. I
PRIOR ART

SOLID-STATE IMAGING DEVICE WITH HIGH QUASI-SIGNAL SWEEP-OUT EFFICIENCY AND HIGH SIGNAL CHARGE TRANSFER EFFICIENCY

BACKGROUND OF THE INVENTION

The present invention relates to a two-dimensionally arrayed solid-state imaging device having a photosensor unit comprising a photodiode matrix which is vertically scanned by a shift register and horizontally scanned by charge transfer devices.

FIG. 1 shows an example of a prior art two-dimensionally arrayed solid-state imaging device having a MOS-type photodiode array as a photosensor unit and a charge transfer device (CTD) in a horizontal scanning circuit. A similar imaging device is shown in the Preparatory Print for 1981 General Meeting of the Institute of Television Engineers of Japan, page 107.

In FIG. 1, numeral 1 denotes photodiodes, numeral 2 denotes vertical switching MOS transistors (MOST's) for addressing vertically. The photodiodes 1 and the MOST's 2 are arranged in a two-dimensional matrix. Numeral 3 denotes a vertical scanning circuit for producing a vertical address signal, numeral 4 denotes a charge transfer circuit for a horizontal scanning CTD, numeral 5 denotes a signal output circuit, numeral 6 denotes vertical signal lines, numeral 7 denotes first storage capacitors for supplying bias charges to efficiently transfer charges on the vertical signal lines 6 to the CTD, numeral 8 denotes second storage capacitors having similar functions, numeral 9 denotes third transfer gates serving as switches for isolating the vertical signal lines 6 from the first storage capacitors 7, numeral 10 denotes second transfer gates serving as switches for isolating the first storage capacitors 7 from the second storage capacitors 8, numerals 11 and 12 denote gates and drains for sweeping out quasi-signals such as vertical smears from the vertical signal lines 6, and numeral 13 denotes first transfer gates serving as switches for isolating the chrage transfer circuit 4 of the CTD from the second storage capacitor 8.

In the solid-state imaging device shown in FIG. 1, a high signal-to-noise ratio is expected due to enhanced smear suppression by sweeping out the quasi-signal such as the vertical smear to the drains 12, but it has the following problem. Since the bias charges are supplied by the first and second storage capacitors 7 and 8, the charge transfer efficiency from the vertical signal lines 6 to the first storage capacitors 7 and the charge transfer efficiency from the first storage capacitors 7 to the second storage capacitors 8 are high, but the charge transfer efficiency from the second storage capacitor 8 to the drains 12 for the quasi-signal such as vertical smears and the charge transfer efficiency from the second storage capacitors 8 to the CTD charge transfer circuit 4 for an image signal is not high because of lack of the bias charges. Particularly, when the signal charges are less under a low illumination or the smear charges are less, the charge transfer efficiency is as low as 50% or less to degrade smear suppression and decrease signal charges, with a result that the expected characteristic is hardly attained. Further, because the capacitors for supplying the internal bias are in two stages, the construction of the horizontal CTD and the MOS-type picture cell array is complex.

SUMMARY OF THE INVENTION

It is, therefore, an object of the present invention to provide a solid-state imaging device which attains a high efficiency sweep-out of quasi-signals from vertical signal lines to quasi-signal sweep-out drains and a high efficiency transfer of signal charges to the charge transfer sections of a CTD by a simple circuit configuration.

In order to achieve the above object, the solid-state imaging device of the present invention of the type described above has internal bias charge storage means and the quasi-signal sweep-out drains provided between the CTD and the vertical signal lines, and a CTD provided with bias charge input means. For charge transfer from the vertical signal lines to the bias charge storage means for quasi-signals and image signals, internal bias charges are first transfer-red from the bias charge storage means to the vertical signal lines and then the quasi-signal charges and image signal charges are transferred along with the internal bias charges to the bias charge storage means. For charge transfer from the bias charge storage means to the quasi-signal sweep-out drains for the quasi-signals, bias charges are injected directly from the quasi-signal sweep-out drains into the bias charge storage means and then the quasi-signal charges are transferred along with the injected bias charges from the bias charge storage means to the sweep-out drains. For read-out of image signal charges from the bias charge storage means by the CTD, bias charges having been supplied from the bias charge input means to the charge transfer sections of the CTD are injected from the charge transfer sections into the bias charge storage means and then the image signal charges are read out from the bias charge storage means along with the injected bias charges by the CTD. That is, in the present invention, for sweep-out of the quasi-signals such as the vertical smears, bias charges are injected from the sweep-out drains, and for read-out of the image signals having been supplied from the bias charge input means to the charge transfer sections of the CTD injected from respective transfer sections of the CTD, whereby the efficiency of sweep-out of the quasi-signals from the bias charge storage means and the efficiency of readout of the image signal charges from the bias charge storage means are enhanced to provide a high quality of video signals.

DESCRIPTION OF THE PREFERRED EMBODIMENTS

Figure 1:
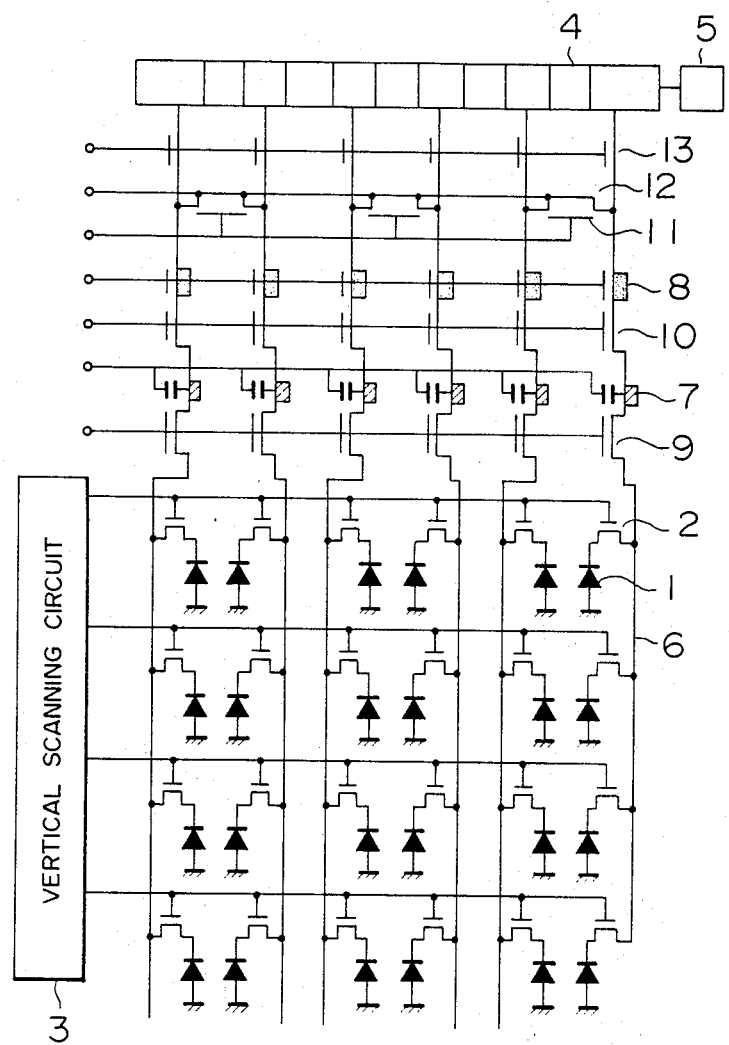
FIG. 1 is a circuit diagram of a prior art solid-state imaging device.
Figure 2:
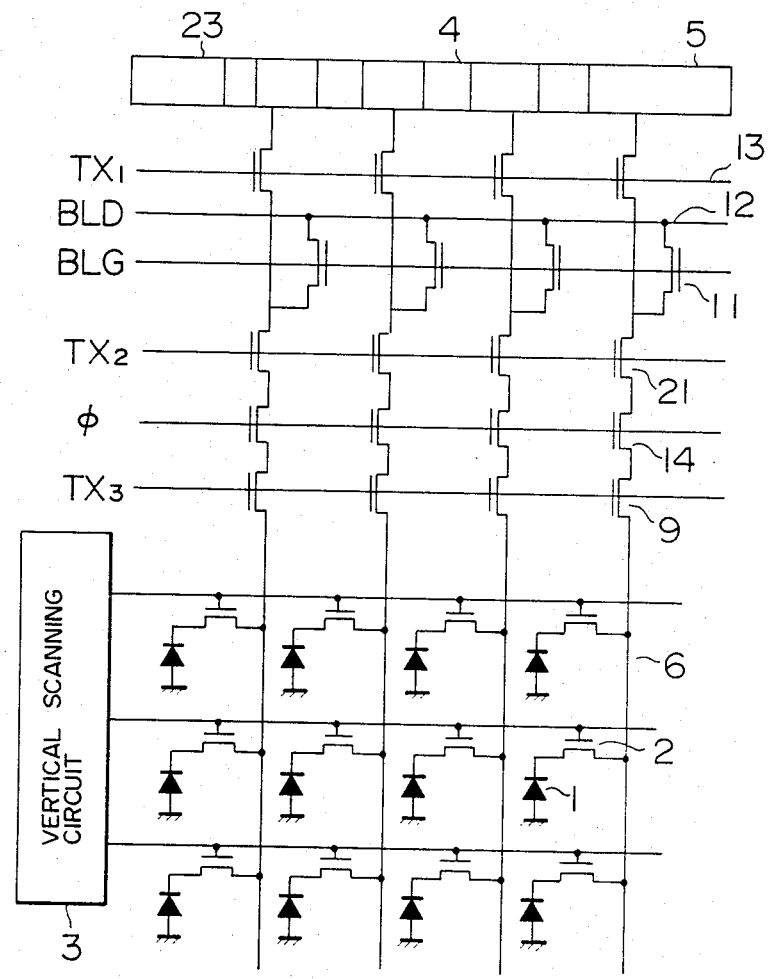
FIG. 2 is a circuit diagram of one embodiment of a solid-state imaging device of the present invention.

FIG. 2 shows one embodiment of the present invention, in which like elements to those shown in FIG. 1 are designated by like numerals. Numeral 14 denotes bias charge storage means and numeral 21 denotes second transfer gates which branch the sweep-out of the quasi-signals from the signal readout paths. Further, according to the invention, the signal readout CTD is provided with a bias charge input circuit 23.

In the present embodiment, the quasi-signals such as the vertical smears which have leaked into the vertical signal lines 6 are efficiently transferred from the vertical signal lines 6 to the storage means 14 by the bias charges supplied from the bias charge storage means 14. Then, the bias charges are supplied from the quasi-signal sweep-out drains 12 to the storage means 14 and the quasi-signals from the storage means 14 are efficiently swept out from the quasi-signal sweep-out drains 12. Then, the image signal charges are transferred from the vertical signal lines 6 to the storage means 14 by the use of the bias charges supplied from the storage means 14. Finally, the image signal charges are read from the storage means 14 into the CTD by the use of the bias charges previously supplied from the bias charge input circuit 23 to the transfer sections of the CTD.

In this manner, the transfer efficiency of the charges from the storage means 14 is enhanced, the leakage of the quasi-signals into the signal charges are prevented and a high quality of image is produced even in a low illumination.

Figure 3:
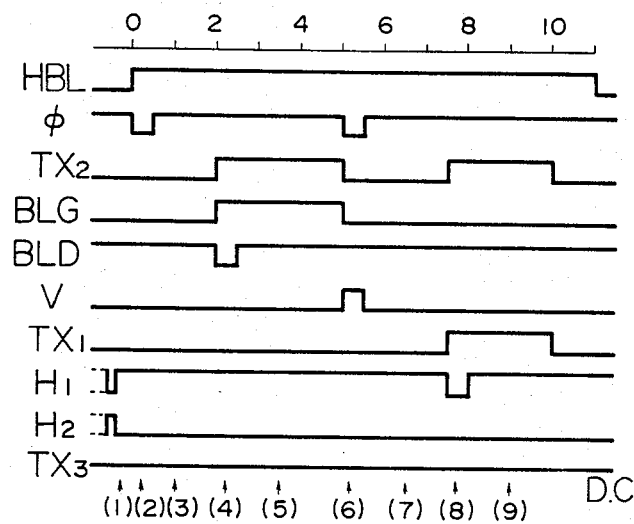
FIG. 3 is a drive pulse timing chart of the device shown in FIG. 2.
Figure 4:
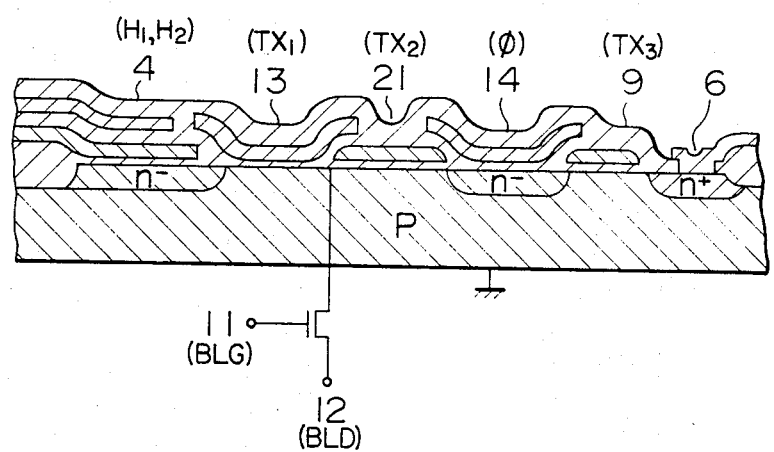
FIG. 4 is a sectional view of a structure of a CTD and a MOS-type picture cell array of the device shown in FIG. 2.
Figure 5:
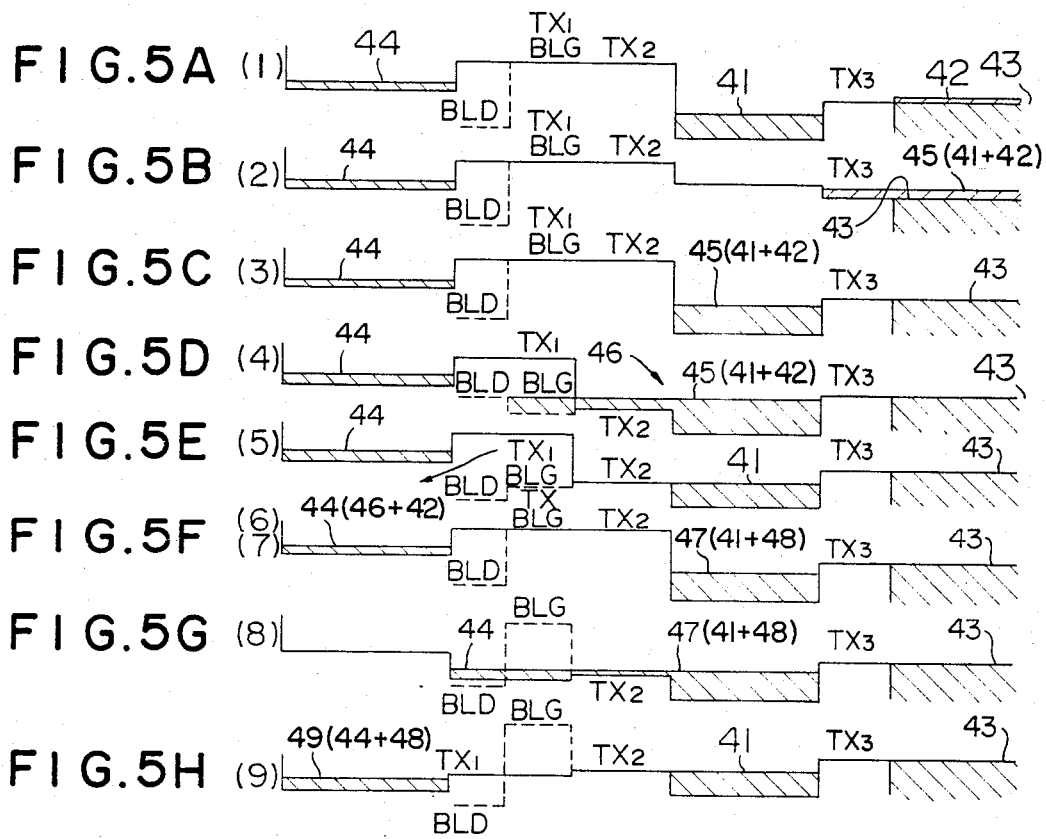
FIGS. 5A to 5H show potentials of various portions at (4)–(9) of FIG. 3.
Figure 6:
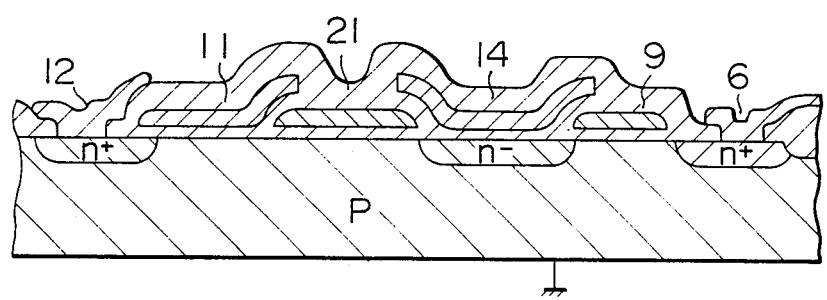
FIG. 6 is a sectional view of a structure of a quasi-signal sweep-out gate, a drain and a MOS-type picture cell array corresponding to FIG. 4.

FIG. 3 shows an example of a drive pulse timing of the solid-state imaging device of FIG. 2. $TX_1$, $TX_2$, $TX_3$, BLG and BLD represent potentials of the first, second and third transfer gates 13, 21 and 9, the quasi-signal sweep-out MOST gate 11 and the drain 12, respectively, and $H_1$ and $H_2$ represent drive pulses of the charge transfer circuit 4 of the CTD. V represents a potential at the gate of one of the vertical switching transistors 2, HBL represents a horizontal blanking pulse and $\phi$ represents a potential of the bias charge storage means 14. $TX_3$ represents a D.C. potential. FIG. 4 shows a sectional view of a structure of a junction portion of the MOS-type picture cell array and the horizontal CTD, FIGS. 5A–5H show potentials at various portions at (1)–(9) of FIG. 3 and FIG. 6 shows a sectional view including the quasi-signal sweep-out MOST. A potential BLG of the gate 11 and a potential BLD of the drain 12 are shown by broken lines in FIGS. 5A–5H. In FIGS. 5A–5H, numeral 41 denotes the bias charge in the storage means 14, numeral 42 denotes the quasi-signal, numeral 43 denotes a reference potential for the signal line 6 and numeral 44 denotes the bias charge in the CTD.

Referring to FIGS. 2 to 6, the operation of the device of the present embodiment will be explained in detail. The CTD is operated in a horizontal scanning period and signal charges in the CTD 4 are sequentially transferred to the signal output circuit 5 and the constant bias charge is sequentially transferred from the input circuit 23. At the end of the horizontal scanning period, all of the signals have been read out and a constant number of bias charges 44 are present at each stage or section of the charge transfer circuit 4. The internal bias charges 41 are stored in the storage means 14 and the quasi-signal 42 such as the smear charges 41 are stored in the vertical signal lines 6 (FIG. 5A, (1)). In order to increase the rate of the sweep-out of the quasi-signal from the vertical signal line 6 to the storage means 14, the potential $\phi$ is set to a low level so that the internal bias charges stored in the storage means 14 are first transferred to the vertical signal line 6 and are mixed with the quasi-signal 42 (FIG. 5B, (2)). Numeral 45 denotes a mixture of the internal bias charges and the quasi-signal charges. Then, the potential $\phi$ is set to a high level so that the quasi-signal 42 is transferred along with the internal bias charges 41 to the storage means 14 with the vertical signal line 6 being clamped to the reference potential $V_{VC}$ (indicated by 43 in FIGS. 5A–5H) defined by the following equation (1) (FIG. 5C, (3)).

$$V_{VC} = TX_3 - V_{T,T3} \tag{1}$$

where $V_{T,T3}$ is a threshold voltage of the MOST which is the third transfer gate 9.

In order to increase the rate of sweep-out of the quasi-signal from the storage means 14, $TX_2$ and BLG are set to the high level and BLD is set to the low level so that bias charges 46 flow from the quasi-signal sweep-out drain 12 into the storage means 14 (FIG. 5D, (4)). At this time, the potential of the storage means 14 is reset to the low level of BLD. As BLD is again set to the high level, the bias charges 46 are transferred back to the sweep-out drains 12, when the quasi-signal 42 is swept out along with the bias charges 46 to the swept-out drains 12. As a result, the only previously stored internal bias charges 41 remain in the storage means 14 (FIG. 5E, (5)). Through those two steps of transfer, the quasi-signal 42 such as the smear current in the vertical signal lines 6 is swept out of the quasi-signal sweep-out drains 12.

If the bias charges supplied from the quasi-signal sweep-out drain 12 to the storage means 14 reach the vertical signal lines 6, so-called fixed pattern noise which will cause vertical stripes on a screen wire be generated. Therefore, the low level $V_{BLD}$ of BLD should be higher than the reference level $V_{vc}$ of the vertical signal lines 6 defined by equation (1). That is, the following relation must be met.

$$V_{BLD} \geq TX_3 - V_{T,T3} \tag{2}$$

Then, BLG is set to the low level, and BLG and BLD have no connection with the subsequent operation. When the potential of one of the vertical gate lines is high under this condition, the signal charges 48 of the photodiode in one row (row n) are transferred to the vertical signal line 6. These signal charges 48 are transferred from the vertical signal line 6 to the storage means 14 in the same manner as when the quasi-signal 42 was transferred from the vertical signal line 6 to the storage means 14. That is, when $\phi$ is set to the low level, the internal bias charges 41 in the storage means 14 are transferred again to the vertical line 6 and are mixed with the signal charges 48 in order to increase the signal charge transfer rate from the vertical signal line 6 to the storage means 14. Then, when $\phi$ is set to the high level, the signal charges 48 on the vertical signal line 6 are transferred along with the internal bias charges 41 to the storage means 14 so that the vertical signal line 6 assumes $V_{VC}$ represented by the equation (1). At the end of the above step, both the internal bias charges 41 and the signal charges 48 are present in the storage means 14 (FIG. 5F, (6) and (7)). Numeral 47 represents a mixture of the internal bias charges 41 and the signal charges 48.

Then, when $H_1$ is set to the low level and $TX_1$ and $TX_2$ are set to the high level, the bias charges 44 under the electrode $H_1$ of the transfer section 4 of the CTD 4 are transferred to the storage means 14 in order to increase the charge transfer rate from the storage means 14 to the CTD (FIG. 5G, (8)). As the electrode $H_1$ of the charge transfer sections of the CTD is then set to the high level, the bias charges 44 supplied from the charge transfer sections of the CTD and the signal charges are transferred to the charge transfer sections of the CTD so that only the previously stored internal bias charges 41 remain in the storage means 14. Through those two steps of transfer, the signal charges are transferred from the vertical signal line 6 to the CTD (FIG. 5H, (9)).

In this manner, the signal charges in the row n are transferred to the CTD. The transfer sections of CTD are then driven in the horizontal scanning period so that the signal charges 48 are transferred along with the bias charges 44 to the charge transfer sections of the CTD thereby to produce a signal at the signal output circuit 5 of the CTD.

In the present embodiment, the MOST which is the third transfer gate 9 to determine the clamp level of the vertical signal line 6 is D.C. driven. Alternately, it may be pulse driven.

While MOST floating capacitances are used as the storage means 14 in the described arrangement, they may be diffusion layer capacitances.

Figure 7:
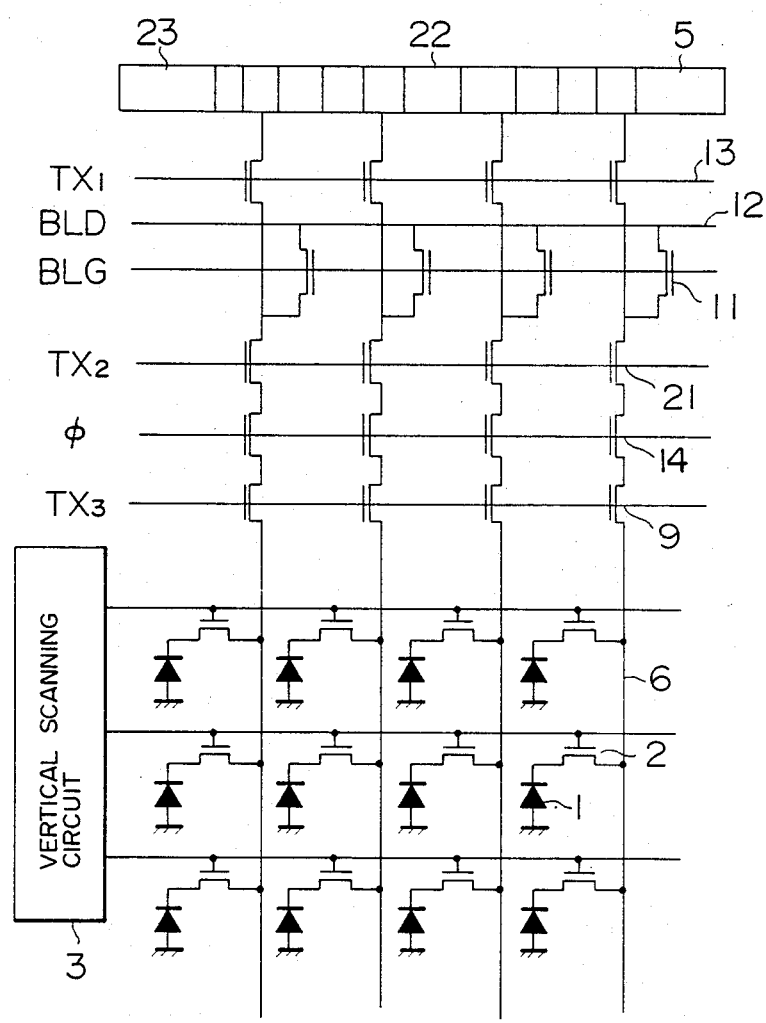
FIG. 7 is a circuit diagram of another embodiment of the solid-state imaging device of the present invention.
Figure 8:
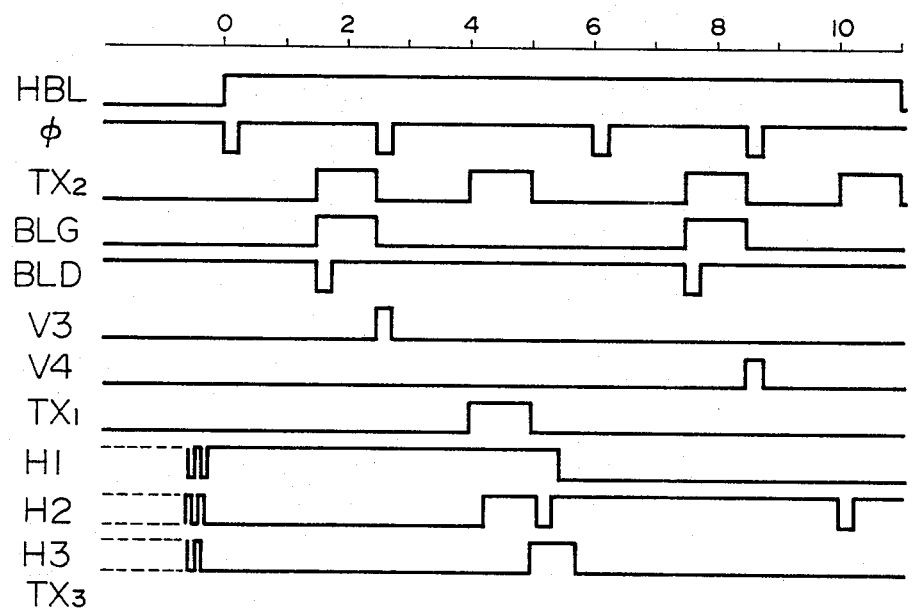
FIG. 8 is a drive pulse timing chart of the device shown in FIG. 7.

In a single plate or substrate color solid-state imaging device, it has been known that a two-line parallel read-out system is effective because it is free from residual image and provides a high quality of image with a high resolution (N. Koike et al, 1979 ISSCC Digest, page 193). As an approach to the two-line parallel readout system, an embodiment shown in FIG. 7 three-phase drives the CTD which functions as the horizontal scanning circuit. The embodiment of FIG. 7 differs from that of FIG. 2 in that the horizontal scanning circuit CTD is a three-phase CTD. FIG. 8 shows an example of a drive pulse timing of the solid-state imaging device of FIG. 7. $H_3$ denotes a potential of a third drive electrode of the CTD and $V_3$ and $V_4$ denote potentials of two different vertical signal lines. In accordance with the present embodiment, the two lines of signals can be transferred to the horizontal scanning circuit CTD through the same path so that the two lines can be parallely read out without the fixed pattern noise.

While the CTD is three-phase driven in the above embodiment, the CTD need not be three-phase driven so long as two signal charges are held at the transfer stages of the CTD corresponding to the vertical signal lines and they are transferred.

As described above, according to the present invention, the quasi-signals on the vertical signal lines are swept out at the sufficiently high transfer efficiency, the signal charges are read into the CTD, the quasi-signals such as the vertical smears are sufficiently suppressed, the high resolution is attained and the high quality of video signal free from color mixture is obtained.

We claim:

1. A two-dimensionally arrayed solid-state imaging device wherein photo-electric conversion elements arranged in a matrix at a photo-setting section are vertically scanned by a shift register and horizontally scanned by a horizontal register constructed by a charge transfer device, and quasi-signals on vertical signal lines are read out during a hozizontal blanking period and then signals on said vertical signal lines are read into said horizontal register, and said horizontal register is driven during a horizontal scanning period to read out said signals, the solid-state imaging device comprising:
   bias charge storage means and quasi-signal sweep-out drains disposed between said horizontal register and said vertical signal lines; and
   bias charge input means arranged in said horizontal register;
   wherein bias charges supplied from said bias charge storage means are used to transfer charges from said vertical signal lines to said bias charge storage means, wherein bias charges directly injected from said quasi-signal sweep-out drains are used to sweep out quasi-signals from siad bias charge storage means to said quasi-signal sweep-out drains, and further wherein bias charges supplied from said bias charge input means are used to read signals from said bias charge storage means into said charge transfer device.

2. A solid-state imaging device according to claim 1, wherein said bias charge storage means are stray capacitances of MOST's.

3. A solid-state imaging device according to claim 1, wherein said bias charge storage means are diffusion layer capacitances.

4. A solid-state imaging device according to claim 1, wherein said horizontal register is three-phase driven.

* * * * *